(12) United States Patent
Miyasaka

(10) Patent No.: US 8,497,997 B2
(45) Date of Patent: Jul. 30, 2013

(54) SEMICONDUCTOR DEVICE AND METHOD OF MANUFACTURING THE SAME

(75) Inventor: Mami Miyasaka, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 402 days.

(21) Appl. No.: 12/801,259

(22) Filed: May 28, 2010

(65) Prior Publication Data

US 2010/0321705 A1 Dec. 23, 2010

(30) Foreign Application Priority Data

Jun. 23, 2009 (JP) ................................. 2009-148386

(51) Int. Cl.
*G01B 11/14* (2006.01)
(52) U.S. Cl.
USPC ........................... 356/620; 356/399; 356/401
(58) Field of Classification Search
USPC .......................................... 356/620, 399–401
See application file for complete search history.

(56) References Cited

U.S. PATENT DOCUMENTS

| | | | | |
|---|---|---|---|---|
| 8,072,615 | B2 * | 12/2011 | Musa et al. ................... | 356/620 |
| 2007/0132996 | A1 * | 6/2007 | Van Haren et al. ........... | 356/401 |
| 2007/0222990 | A1 * | 9/2007 | Musa et al. ................... | 356/401 |
| 2011/0204484 | A1 * | 8/2011 | Van Der Schaar et al. ... | 257/618 |

FOREIGN PATENT DOCUMENTS

| | | |
|---|---|---|
| JP | 2000-252203 | 9/2000 |
| JP | 2000-306822 | 11/2000 |
| JP | 2001-044105 | 2/2001 |
| JP | 2001-102285 | 4/2001 |
| JP | 2003-209037 | 7/2003 |
| JP | 2004-507901 | 3/2004 |
| JP | 2005-031681 | 2/2005 |
| JP | 2007-073970 | 3/2007 |
| WO | WO 02/18871 A1 | 3/2002 |

OTHER PUBLICATIONS

Japanese Office Action dated Apr. 17, 2013 with an English translation.

* cited by examiner

*Primary Examiner* — Tarifur Chowdhury
*Assistant Examiner* — Isiaka Akanbi
(74) *Attorney, Agent, or Firm* — McGinn IP Law Group PLLC

(57) ABSTRACT

A semiconductor device includes an alignment mark. A probe beam is scanned on the alignment mark so as to detect a position coordinate of the alignment mark, and the alignment mark comprises a plurality of bar marks which are arranged in a first predetermined interval along a first direction of scanning the detection beam. Each of the plurality of bar marks comprises a plurality of interconnection marks which are arranged along a second direction orthogonal to the first direction, and a first space between adjacent two of the plurality of interconnection marks is shorter than a wavelength of the detection beam within a range of a design constraint.

21 Claims, 14 Drawing Sheets

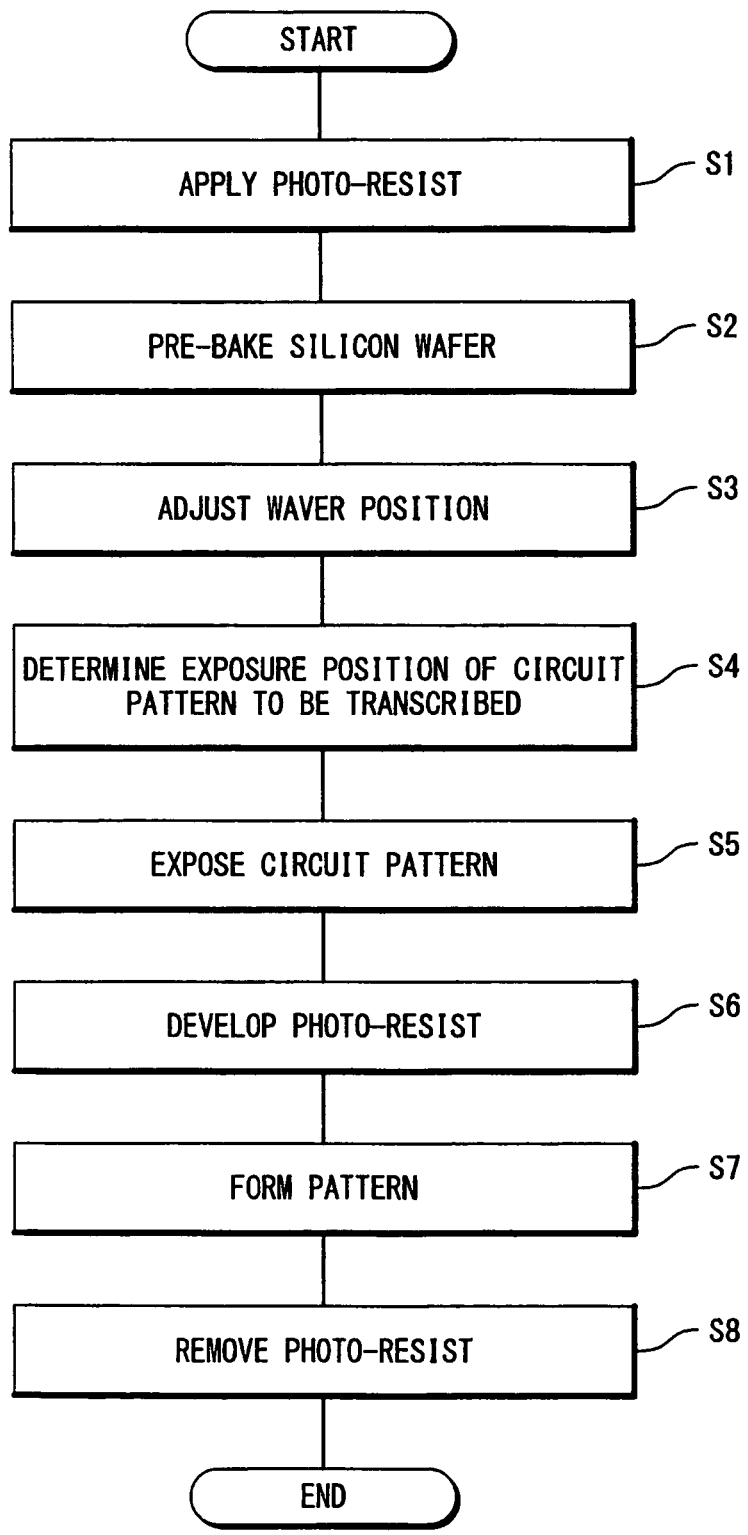

SEMICONDUCTOR DEVICE AND METHOD OF MANUFACTURING THE SAME

INCORPORATION BY REFERENCE

This patent application claims a priority on convention based on Japanese Patent Application No. 2009-148,386 filed on Jun. 23, 2009. The disclosure thereof is incorporated herein by reference.

TECHNICAL FIELD

The present invention relates to a semiconductor device having an alignment mark for a lithography process, a lithography method, and a manufacturing method of the semiconductor device.

BACKGROUND ART

When a semiconductor device having a multilayer structure is manufactured, alignment accuracy between respective layers largely affects performance and quality of the semiconductor device. For this reason, in technical development of a manufacturing process, production engineering development, and manufacturing line, improvement and management of the alignment accuracy are important issues. In a lithography process, respective layers with various elements formed needs to be aligned with each other. In the lithography process, by using an exposure apparatus having an irradiation system, a drive system, and a transfer system, a silicon wafer is exposed based on a desired circuit pattern which is transcribed on a layer of a photo-sensitive resin (hereinafter, to be referred to as a photo-resist layer). When a next circuit pattern is transcribed on the exposed layer, the exposure apparatus is required to align the next circuit pattern with the exposed layer in a high accuracy. The exposure apparatus uses an alignment mark formed previously on the silicon wafer to align the next circuit pattern. Referring to FIG. 1, an aligning process upon transcription of the circuit pattern will be described.

FIG. 1 is a conceptual diagram illustrating an exposing process in the lithography process. Referring to FIG. 1A, the exposure apparatus scans a probe beam on the silicon wafer to detect a position of the alignment mark formed on the silicon wafer. The exposure apparatus determines a position of a circuit pattern of a first layer (hereinafter, to be referred to as an alignment destination layer) transcribed on the silicon wafer from the detected position of the alignment mark. Referring to FIG. 1B, the exposure apparatus exposes and transcribes a circuit pattern of a second layer (hereinafter, to be referred to as an alignment layer) on the alignment destination layer.

As described, in a lithography process, the alignment layer is aligned on the basis of the detected position of the alignment destination layer, and by quantitatively checking alignment accuracy, a desired circuit is manufactured. The alignment accuracy largely depends on accuracy when the exposure apparatus determines the position of the alignment destination layer. That is, the alignment accuracy largely depends on the detection accuracy of the alignment mark when the exposure apparatus scans the probe beam on the alignment mark for the detection of the position of the alignment mark. The accuracy is referred to as alignment measurement accuracy by the exposure apparatus. Although the alignment measurement accuracy depends on accuracy of an alignment measurement mechanism of the exposure apparatus, it also largely depends on a structure of the alignment mark itself.

Referring to FIGS. 2 and 3, an example of the alignment mark for aligning the circuit pattern will be described. FIG. 2 is a diagram illustrating an example of a structure of an alignment mark 100 for detecting an X-coordinate of a transcribed circuit pattern. Referring to FIG. 2, the alignment mark 100 has a plurality of bar marks 101 arranged in a predetermined interval P10. The exposure apparatus scans the probe beam in an X measurement direction, and specifies a position of the alignment mark to detect the X-coordinate of the transcribed circuit pattern. A scanning direction of the probe beam is hereinafter referred to as a measurement direction. The plurality of bar marks 101 are arranged along the X measurement direction in the predetermined interval P10. The shape of the bar mark 101 is a rectangle having short sides (width: a few μm to 10 μm) in the X measurement direction and long sides in a non-measurement direction perpendicular to the X measurement direction. Also, the interval P10 between adjacent bar marks 101 is 10 μm to 100 μm, and the number of bar marks 101 of the alignment mark 100 is a few to a few tens.

FIG. 3 is a diagram illustrating an example of an alignment mark 200 for detecting a Y-coordinate of the transcribed circuit pattern. Referring to FIG. 3, the alignment mark 200 has a plurality of bar marks 201 arranged in a predetermined interval P20. The exposure apparatus scans the probe beam in a Y measurement direction, and specifies a position of the alignment mark to detect the Y-coordinate of the transcribed circuit pattern. The plurality of bar marks 201 are arranged along the Y measurement direction in the predetermined interval P20. The shape of the bar mark 201 is a rectangle having short sides (width: a few μm to 10 μm) in the Y measurement direction and long sides in a non-measurement direction perpendicular to the Y measurement direction. Also, the interval P20 between adjacent two of the bar marks 201 is 10 μm to 100 μm, and the number of bar marks 201 in the alignment mark 200 is a few to a few tens.

In recent years, in accompaniment with miniaturization of a semiconductor device, the size of a pattern to be formed as a circuit pattern is restricted (design constraint) in order to avoid a defect in a manufacturing method such as dry etching and chemical mechanical polishing (CMP). An etching rate at the time of the dry etching and a polishing amount in the CMP vary depending on a pattern size. For this reason, if a pattern size of an alignment mark is different from that of the other circuit element, a defect is generated because of a difference in etching rate or polishing amount in the CMP between the alignment mark and the ordinary pattern. To avoid such a defect, the alignment mark is required to have a pattern size (e.g., mark width less than 1 μm) subjected to the design constraint.

A technique related to the alignment mark will be described in patent literature 1 to patent literature 8.

CITATION LIST

Patent literature 1: JP 2000-252203A
Patent literature 2: JP 2000-306822A
Patent literature 3: JP 2001-44105A
Patent literature 4: JP 2001-102285A
Patent literature 5: JP 2003-209037A
Patent literature 6: JP 2005-31681A
Patent literature 7: JP 2007-73970A
Patent literature 8: JP 2004-507901A

SUMMARY

The present inventor has recognized as follows. If the mark width of the alignment mark is constrained to less than 1 μm, a resolution of an optical image of the mark is degraded and an error increases in alignment measurement. For this reason, the degradation of the alignment measurement accuracy and alignment accuracy makes it difficult to achieve an improvement in performance and high quality assurance of a semiconductor device.

The present inventor has examined a problem of the alignment mark formed to have the mark width determined based on the design constraint (rule). Referring to FIGS. 4 to 7, a result of the resolution examination of the mark having the mark width less than 1 μm will be described. FIGS. 4 and 6 illustrate alignment marks used for experimental evaluations. FIGS. 5 and 7 illustrate results of the experimental evaluations of alignment measurement accuracies based on the alignment marks illustrated in FIGS. 4 and 6.

Here, the alignment measurement accuracies of the alignment mark 100 (see FIG. 4) which does not have the mark width determined based on the design constraint and the alignment mark 300 (see FIG. 6) having the mark width which is determined based on the design constraint are examined. Referring to FIG. 4, in the alignment mark 100, nine bar marks 101 having the mark width of 6 μm in a measurement direction are arranged in the interval of 20 μm in the measurement direction. An examination result of an alignment measurement residual 3σ value for the alignment mark 100 is illustrated in FIG. 5. On the other hand, referring to FIG. 6, in the alignment mark 300, nine bar marks 301 having a mark width of 0.3 μm in the measurement direction are arranged in the interval of 20 μm in the measurement direction. An examination result of the alignment measurement residual 3σ value for the alignment mark 300 is illustrated in FIG. 7.

In general, if the alignment measurement residual 3σ value is close to an appropriate value calculated from stage performance of the exposure apparatus, a measurement error is determined to be minimized (in this experiment, the appropriate value is 20 to 25 nm). Comparing the results shown in FIGS. 5 and 7, the measurement residual 3σ value for the alignment mark 300 is 50 nm, and the accuracy is low almost twice, as compared with the value (approximately 25 nm) for the alignment mark 100.

As described above, if the mark width of the mark is constrained to less than 1 μm, the alignment measurement accuracy is low, which results in low alignment accuracy. Accordingly, it is required to improve and assure the alignment accuracy while complying with the design constraint.

In an aspect of the present invention, a semiconductor device includes an alignment mark. A probe beam is scanned on the alignment mark so as to detect a position coordinate of the alignment mark, and the alignment mark comprises a plurality of bar marks which are arranged in a first predetermined interval along a first direction of scanning the detection beam. Each of the plurality of bar marks comprises a plurality of interconnection marks which are arranged along a second direction orthogonal to the first direction, and a first space between adjacent two of the plurality of interconnection marks is shorter than a wavelength of the detection beam within a range of a design constraint.

In another aspect of the present invention, a manufacturing method of a semiconductor device, is achieved: by irradiating and scanning a detection beam on a first alignment mark formed on a semiconductor substrate with a photo-resist layer; by detecting a coordinate position of the first alignment mark from intensity of reflection of the detection beam; by adjusting a position of the semiconductor substrate based on the detected coordinate position; by irradiating and scanning the detection beam on the first alignment mark and a second alignment mark formed on a mask with a predetermined circuit pattern including the second alignment mark; by detecting coordinate positions of the first and second alignment marks from reflection intensities of the detection beam; by adjusting a relative position of the semiconductor substrate and the mask based on the detected coordinate positions; and by exposing the circuit pattern on a photo-resist layer of the semiconductor substrate. The first alignment mark comprises a plurality of first bar marks which are arranged in a first predetermined interval along a first direction of scanning the detection beam, and each of the plurality of first bar marks comprises a plurality of first interconnection marks which are arranged along a second direction orthogonal to the first direction. A first space between adjacent two of the plurality of first interconnection marks is shorter than a wavelength of the detection beam within a range of a design constraint.

According to the present invention, measurement accuracy or alignment accuracy can be improved while complying with a design constraint.

BRIEF DESCRIPTION OF DRAWINGS

The above and other objects, advantages and features of the present invention will be more apparent from the following description of certain embodiments taken in conjunction with the accompanying drawings, in which:

FIG. 20 is a flowchart illustrating an example of the lithography process according to the present invention.

DETAILED DESCRIPTION OF PREFERRED EMBODIMENTS

Hereinafter, an alignment mark formed on a semiconductor substrate (e.g. a semiconductor wafer or semiconductor chip) and a semiconductor device manufactured from a semiconductor substrate with the alignment mark will be described with reference to the attached drawings.

First Embodiment

Referring to FIGS. 8 to 11, an alignment mark formed on a semiconductor substrate according to a first embodiment of the present invention will be described. An alignment mark 1 in the present embodiment is used to determine a position of a circuit pattern transcribed on a silicon wafer (substrate) (hereinafter, to be referred to as an alignment destination layer).

Figure 1A:
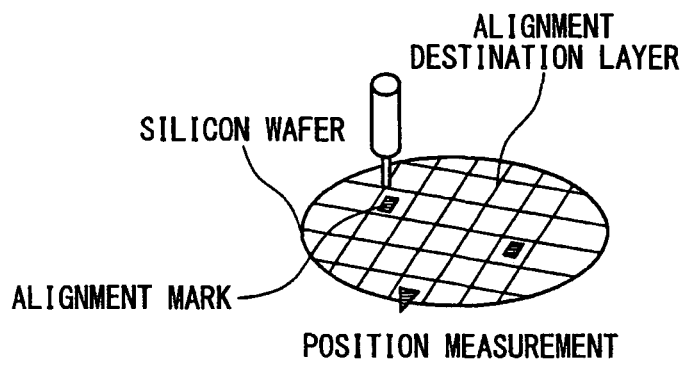
FIG. 1 is a conceptual diagram illustrating alignment exposure in a lithography process.
Figure 1B:
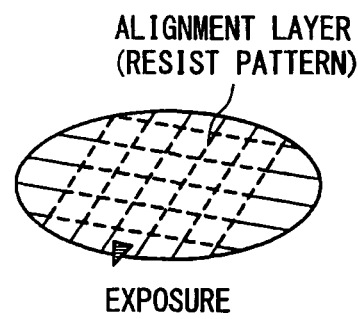
Figure 2:
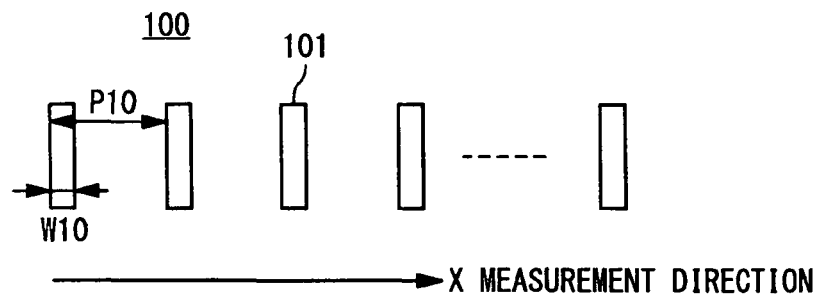
FIG. 2 is a diagram illustrating an example of a structure of an alignment mark for detecting an X-coordinate of a transcribed circuit pattern.
Figure 3:
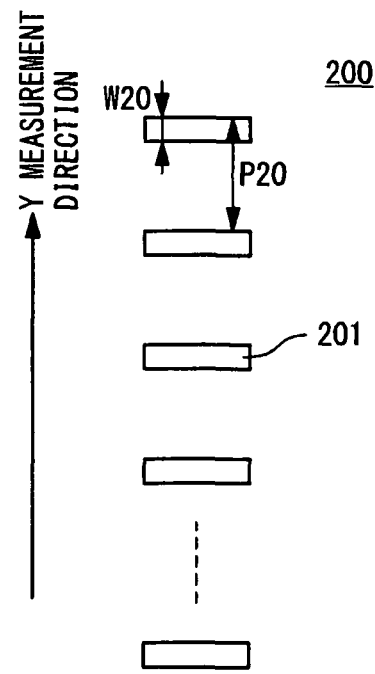
FIG. 3 is a diagram illustrating an example of a structure of an alignment mark for detecting a Y-coordinate of the transcribed circuit pattern.
Figure 4:
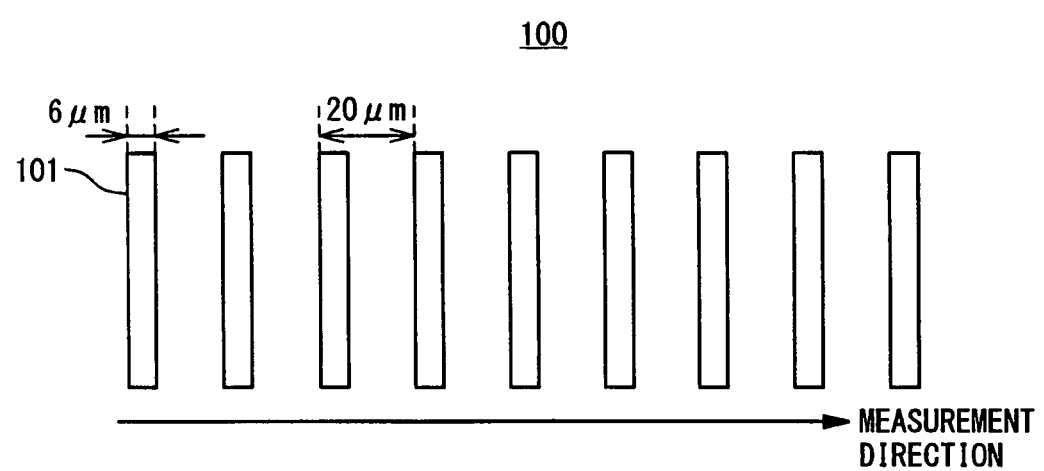
FIG. 4 is a diagram illustrating an alignment mark that is used for experimental evaluations and based on a related technique.
Figure 5:
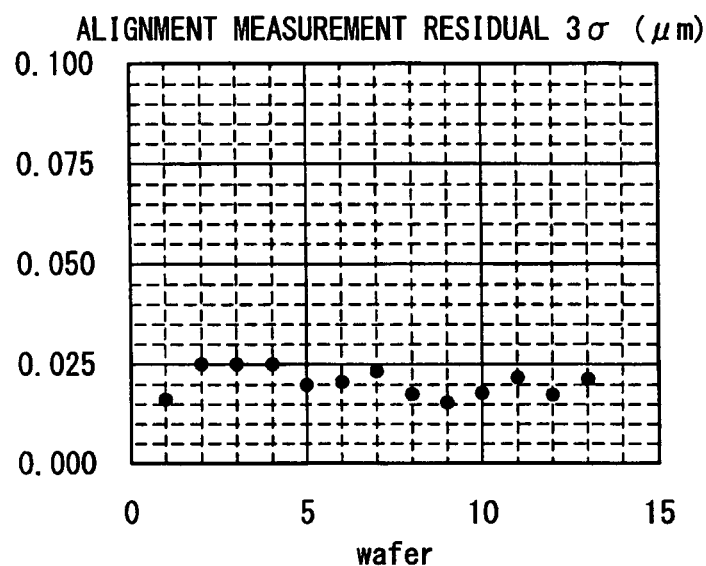
FIG. 5 is a diagram illustrating an examination result of an alignment measurement residual 3σ value for the alignment mark based on the related technique.
Figure 6:
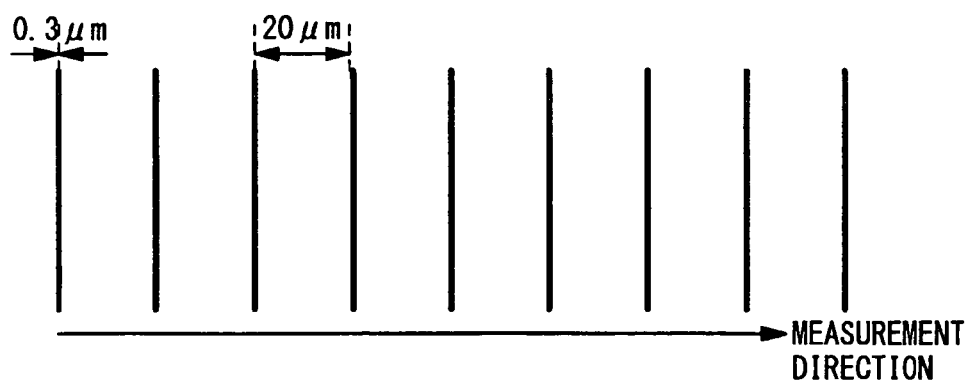
FIG. 6 is a diagram illustrating an alignment mark that is used for the experimental evaluations and produced in compliance with the constrained condition.
Figure 7:
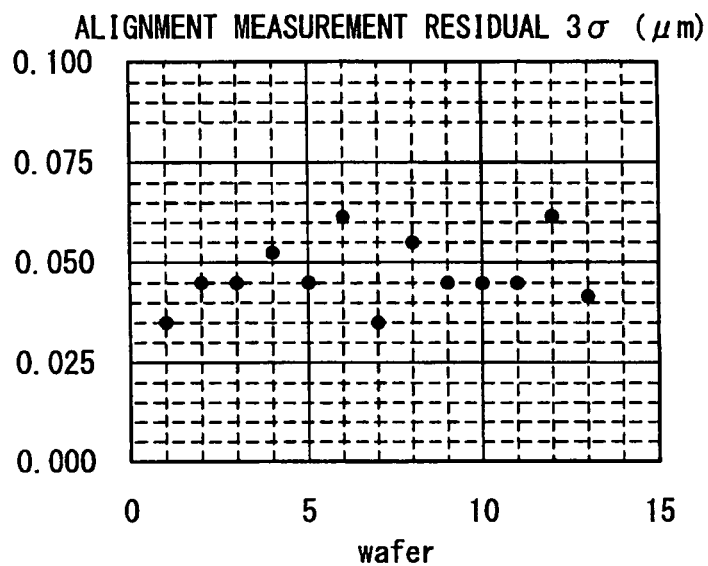
FIG. 7 is a diagram illustrating an examination result of an alignment measurement residual 3σ value for the alignment mark that is used for the experimental evaluations and produced in compliance with the constrained condition.
Figure 8:
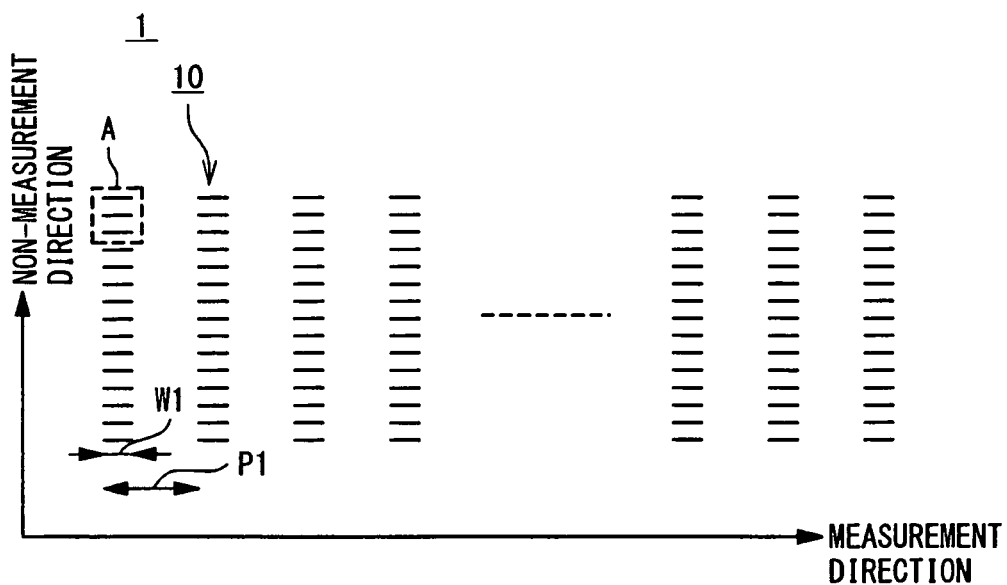
FIG. 8 is a plan view illustrating a structure of an alignment mark according to a first embodiment of the present invention.
Figure 9:
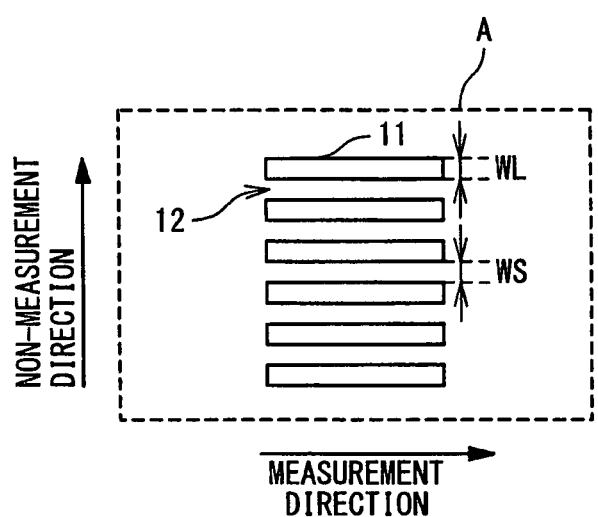
FIG. 9 is a partially enlarged view illustrating details of the structure of the alignment mark in the first embodiment.

Referring to FIGS. 8 and 9, a structure of the alignment mark 1 in the first embodiment will be described. FIG. 8 is a plan view illustrating the structure of the alignment mark 1 in the first embodiment. FIG. 9 is a partially enlarged view showing details of the structure of the alignment mark 1 in the first embodiment.

An exposure apparatus scans a probe beam in a measurement direction, and specifies a position of the alignment mark 1 to detect a coordinate of a transcribed circuit pattern. A scanning direction of the probe beam is referred to as a measurement direction hereinafter. Based on a measurement principle of the exposure apparatus, the measurement direction for the alignment mark 1 is a meaningful direction, and uniquely defined from an appearance of the mark.

Referring to FIG. 8, the alignment mark 1 has a plurality of bar marks 10 arranged along the measurement direction in a predetermined interval P1. The interval P1 between the bar marks 10 adjacent to each other in the measurement direction is, for example, 10 μm to 100 μm, and the number of bar marks 10 of the alignment mark 1 is a few to a few tens. A size (width W1) of the bar mark 10 in the measurement direction is a few μm to 10 μm, and a size in a direction perpendicular to the measurement direction (hereinafter to be referred to as a non-measurement direction) is basically arbitrary (e.g. 10 μm to 100 μm).

Referring to FIG. 9, the bar mark 10 is formed of a plurality of interconnection marks 11 and spaces 12 that are alternately arranged in the non-measurement direction. The interconnection mark 11 is an interconnection pattern such as a metal wiring and a silicide wiring having longitudinal direction in the measurement direction. A mark width WL of the interconnection mark 11 in the non-measurement direction is less than 1 μm between a lower limit and upper limit in a design constraint. A width of the interconnection mark 11 in the measurement direction (width in the longitudinal direction) is the same as the size of the bar mark 10 in the measurement direction, i.e., a few μm to 10 μm.

The space width WS of the space 12 between the interconnection marks 11 is preferably set to be shorter than a wavelength of the probe beam. In general, an alignment measurement optical system uses the probe beam (detection beam) having a wavelength band (approximately 500 nm to 1000 nm) in a visible range. For this reason, it is better to set the space width WS to be less than 1 μm, preferably less than 0.5 μm. For example, the mark width WL of the interconnection mark 11 and the space width WS of the space 12 are both 0.3 μm.

The reason why the space width WS is set to be shorter than the wavelength of the probe beam is as follows: If the space width WS is equal to or larger than the wavelength of the probe beam, the space 12 is detected. In the present invention, by setting the space width WS to be less than the wavelength of the probe beam, the space width WS becomes equal to or less than a resolution of the probe beam. Thus, the bar mark 10 cannot be detected as being divided. That is, the bar mark 10 is recognized by the probe beam, as a column-like mark which is not divided in the non-measurement direction, and therefore alignment measurement accuracy equivalent to the case of an undivided bar mark can be obtained.

In general, a resolution is expressed by $\delta = 0.61 \times \lambda / NA$. $\lambda$ is the wavelength of the probe beam, and NA is a numerical aperture. The numerical aperture is typically about 0.6, and therefore the resolution $\delta$ is of the order of the wavelength of the probe beam. That is, even if the bar mark is divided into the interconnection marks having the spaces narrower than the resolution $\delta$, the bar mark can be seen as it is a column-like mark if the space is shorter than the resolution. It should be noted that in many cases, the numerical aperture NA of the alignment optical system is typically 0.2 to 0.6, and that of the alignment measurement optical system is typically 0.7 to 0.9. In this case, the resolution $\delta$ is 0.68 to 3 times as much as the wavelength $\lambda$. As an example, if the wavelength of the probe beam is 1000 nm, the space width WS shorter than at least 680 nm will be better.

In the above, the space width WS has been described. However, the same is true for the mark width WL. Also, in the case of setting the space width WS and the mark width WL to be the same value, in addition to design facilitation, the following effect is obtained. That is, the interconnection marks 11 and the spaces 12 are arranged in a constant interval, and therefore light interference from the interconnection marks 11 and the spaces 12 occurs. Here, there is an advantage that a standing wave generated by the light interference is limited to one fundamental wave (including integral multiples of the fundamental wave). On the other hand, if the interconnection mark 11 and the space 12 are different in width, the standing waves (frequencies obtained by Fourier transformation of an in-plane periodic structure) respectively having a plurality of fundamental waves corresponding to respective intervals (in the in-plane periodic structure) are formed. Therefore, an unintended reflected beam intensity of the probe beam due to the plurality of standing waves is observed, which may leads to erroneous recognition of the position of the alignment mark.

Also, if the intensity of a reflected beam from the interconnection mark 11 is too larger than that from the space 12, a resolution of the bar mark 10 may be reduced. For this reason, the mark width WL of the interconnection mark 11 and the space width WS of the space 12 are preferably the same.

Figure 10:
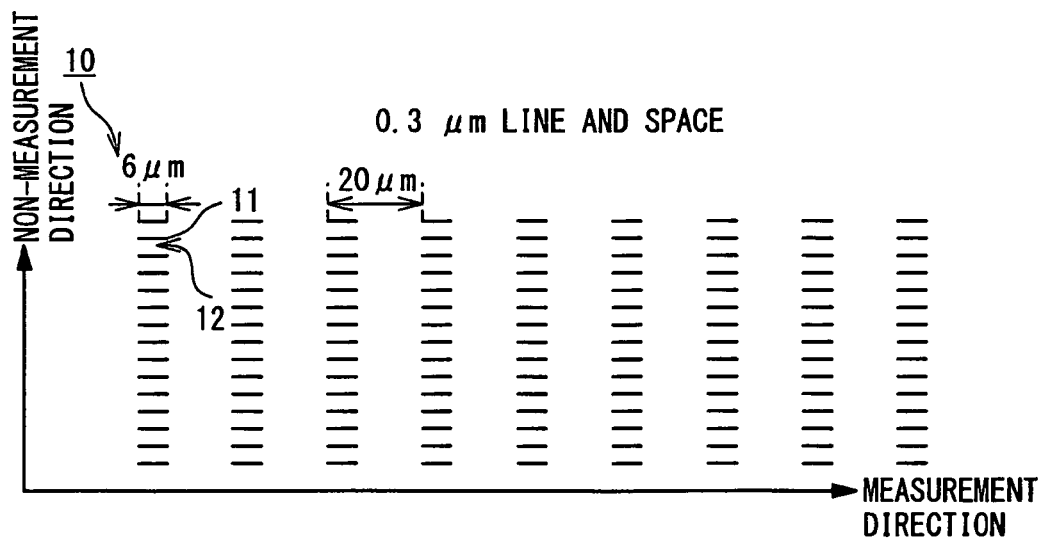
FIG. 10 is a diagram illustrating an example of the structure of the alignment mark in the first embodiment.
Figure 11:
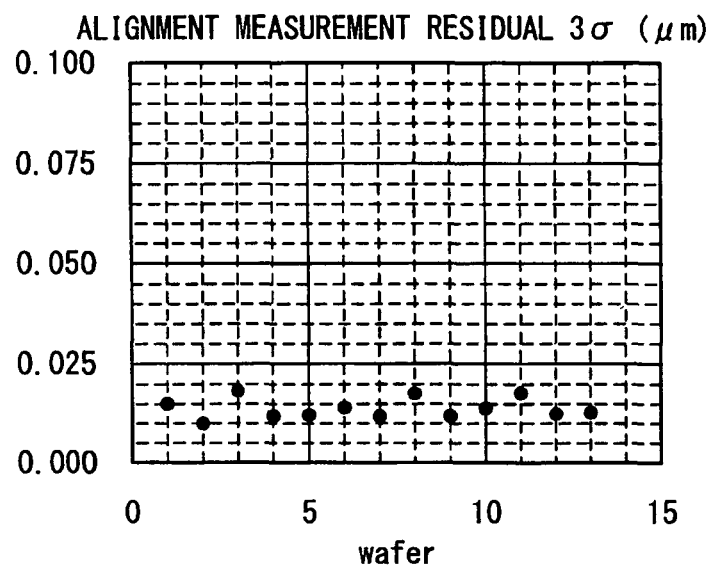
FIG. 11 is an alignment measurement residual 3σ characteristic diagram illustrating a measurement accuracy of the alignment mark in the first embodiment.

Referring to FIGS. 10 and 11, a specific example of the alignment mark 1 in the present embodiment will be described. FIG. 10 is a diagram illustrating an example of the structure of the alignment mark 1 in the first embodiment. FIG. 11 is an alignment measurement residual 3σ characteristic diagram illustrating a measurement accuracy of the alignment mark 1 in the first embodiment.

The alignment mark 1 illustrated in FIG. 10 is provided with nine bar marks 10 arranged along the measurement direction. The width W1 of the bar mark 10 in the measurement direction is 6 μm, and an interval P1 between the bar marks 10 adjacent to each other in the measurement direction is 20 μm. Also, under the assumption that a lower limit and an upper limit in the design constraint are respectively 0.2 μm and 0.3 μm, the mark width WL of the interconnection mark 11 and the space width WS of the space 12 in the non-measurement direction are both 0.3 μm.

The alignment measurement accuracy in the present invention will be described by taking the measurement accuracy of the alignment mark 1 illustrated in FIG. 10 as an example. Using the alignment measurement residual 3σ, which is a quantitative index for evaluating the alignment measurement accuracy, the measurement accuracy of the alignment mark 1 will be described. In general, if a coordinate measured from the alignment mark is close to an appropriate value (coordinate) calculated from stage performance of an exposure apparatus, a measurement error is determined to be minimized. In this experiment, the alignment measurement optical system uses as a light source, the probe beam (detection beam) near a visible region (wavelength region of approximately 500 nm to 1000 nm), and the numerical aperture NA is approximately 0.2 to 0.6 in the alignment optical system. In this experiment, a generally used light source is used for the probe beam (detection beam). In this case, if the alignment measurement residual 3σ value is 20 nm to 25 nm, the value is determined to be appropriate.

Referring to FIG. 11, as a result of the experiment, the alignment measurement residual 3σ value of the alignment mark 1 illustrated in FIG. 10 is 25 nm or less, i.e., good measurement accuracy is obtained. Although not illustrated, in the case of setting the mark width WL of the interconnection mark 11 and the space width WS the space 12 in the non-measurement direction to be 1 μm, or in the case of forming the bar marks from interconnection marks separated in the measurement direction, a measurement error (measurement residual 3σ value) increases. In the case of dividing the interconnection mark 11 in the measurement direction to form it in a dot shape, a reflection intensity from the mark reduces, and visibility of the bar mark 10 (alignment mark 1) is degraded to thereby increase the measurement error (measurement residual 3σ value).

In the present invention, the interconnection marks 11 extending in the longitudinal direction (the measurement direction) form the bar mark 10. Therefore, a difference in reflected light intensity between the bar mark 10 and the background is clear. Also, the mark width WL of the interconnection mark 11 and the space width WS of the space 12 in the non-measurement direction are less than 1 μm that is shorter than the wavelength of the probe beam. Therefore, the resolution of the bar mark 10 is improved. For this reason, even if the bar mark 10 is formed from interconnection marks 11 having a mark width complying with the design constraint, the position (coordinate) of the alignment mark 1 can be detected with good measurement accuracy.

Also, the alignment accuracy to be described later largely depends on an accuracy with which the exposure apparatus determines the position of the alignment destination layer, and the accuracy largely depends on an accuracy (alignment measurement accuracy) with which the exposure apparatus scans the alignment mark to detect the position of the alignment mark. For this reason, by improving the alignment measurement accuracy as described above, the alignment accuracy can also be improved.

Second Embodiment

Referring to FIGS. 12 to 19, the alignment mark according to a second embodiment of the present invention will be described.

Figure 12:
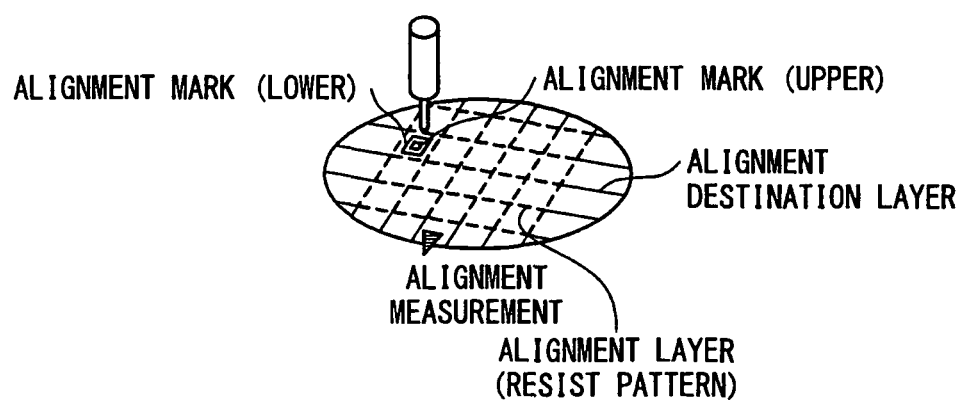
FIG. 12 is a conceptual diagram illustrating alignment measurement in a lithography process.

Referring to FIG. 12, after exposure, alignment accuracy between an alignment layer as a mask pattern and an alignment destination layer that has been formed on a silicon wafer is measured by an alignment measuring instrument. A circuit pattern transcribed for each layer has an alignment mark for measuring alignment. The alignment measuring instrument measures a relative position between a mark (hereinafter to be referred to as an alignment mark (lower)) on the alignment destination layer having been formed on the silicon wafer and a mark (hereinafter to be referred to as an alignment mark (upper layer)) on the alignment layer present as the mask pattern to quantify the alignment accuracy between the alignment layer and the alignment destination layer. In this way, in the lithography process, on the basis of positional data of the lower layer (alignment destination layer), the upper layer is aligned, and further, by quantitatively measuring the alignment accuracy, a desired circuit is achieved through a lithography process.

The alignment accuracy depends on an accuracy with which the alignment measuring instrument measures the relative position between the alignment layer and the alignment destination layer, and the accuracy largely depends on an accuracy with which the alignment measuring instrument detects positions of the alignment marks (upper and lower layers). The accuracy is referred to as an alignment measurement accuracy of the alignment measuring instrument. Although the alignment measurement accuracy depends on accuracies of optical and measurement systems in the alignment measuring instrument, it largely depends on structures of the alignment marks, and is largely affected by the structure of the alignment mark (lower).

The alignment mark according to the present invention can be applied to the alignment marks used for the alignment between the alignment destination layer and the alignment layer. As the alignment mark in the second embodiment, the alignment marks will be described.

Figure 13:
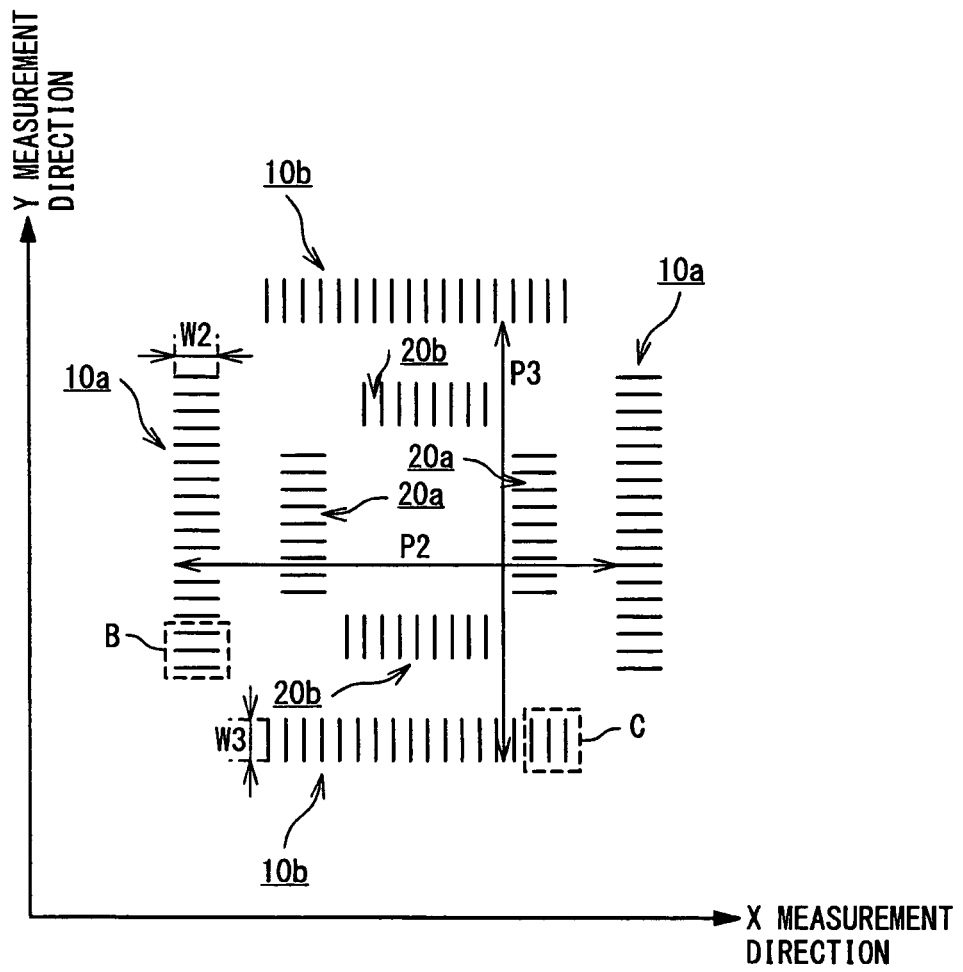
FIG. 13 is a plan view illustrating structures in the second embodiment of the alignment marks (alignment marks (upper and lower layers)) according to the present invention.
Figure 14:
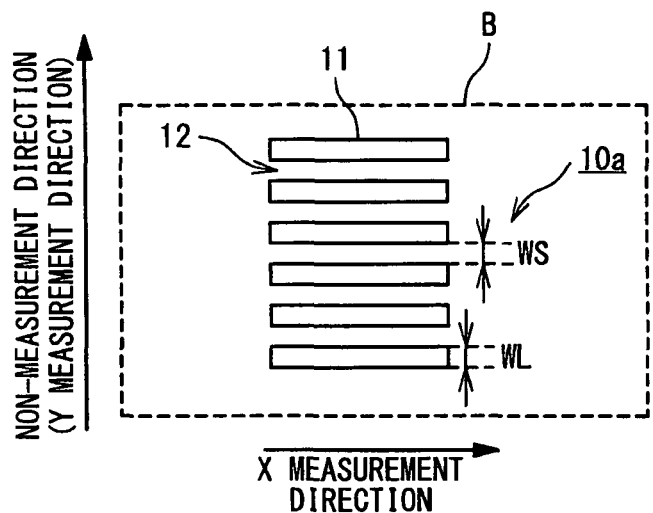
FIG. 14 is a partially enlarged view illustrating details of the structure of the alignment mark (lower layer) in the second embodiment.
Figure 15:
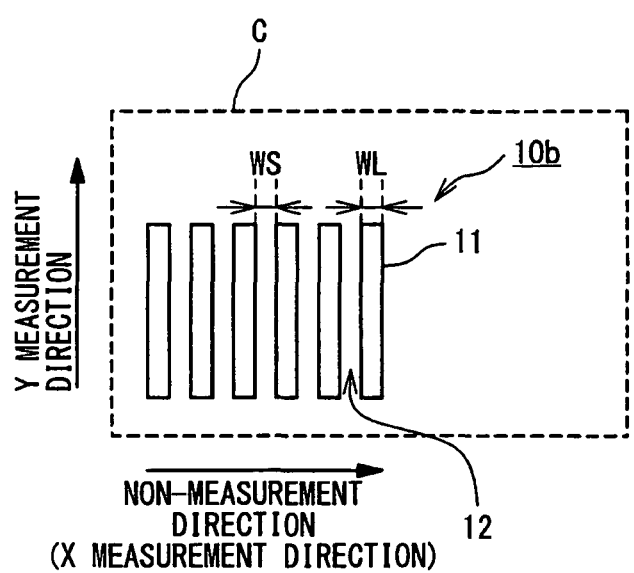
FIG. 15 is a partially enlarged view illustrating details of the structure of the alignment mark (lower layer) in the second embodiment.

The structure of the alignment marks in the second embodiment will be described. FIG. 13 is a plan view illustrating the structure of the alignment marks (upper and lower layer) according to the second embodiment of the present invention. FIGS. 14 and 15 are partially enlarged views illustrating details of the structure of the alignment mark (lower) in the second embodiment.

The alignment measuring instrument scans a probe beam in a measurement direction to measure the relative position between the alignment marks (upper and lower layers). A scanning direction of the probe beam in an X-axis direction is hereinafter referred to as an X measurement direction, and a scanning direction in a Y-axis direction as a Y measurement direction. Based on a measurement principle of the alignment measuring instrument, the measurement directions of the alignment marks are meaningful directions, and uniquely defined from appearances of the marks.

Referring to FIG. 13, the alignment mark (lower layer) according to the present invention is provided with bar marks 10a for measuring an X-coordinate of the alignment destination layer and bar marks 10b for measuring a Y-coordinate of the alignment destination layer. The alignment mark (lower layer) has two bar marks 10a that are arranged along the X measurement direction in a predetermined interval P2. The alignment measuring instrument measures the bar marks 10a in the X measurement direction and measures the X-coordinate of the alignment destination layer. The interval P2 between the bar marks 10a adjacent to each other in the X measurement direction is, for example, 10 μm to 100 μm. In the present embodiment, the alignment mark having the two bar marks 10a is exemplified. However, the number of bar marks 10a can be arbitrarily set (e.g., a few to approximately ten). A size (width W2) of the bar mark 10a in the X measurement direction is a few μm to 10 μm, and a size in a non-measurement direction (Y measurement direction) perpendicular to the X measurement direction is basically arbitrary (e.g., 10 μm to 100 μm).

The alignment mark (lower layer) has two bar marks 10b that are arranged along the Y measurement direction at a predetermined interval P3. The alignment measuring instrument measures the bar marks 10b in the Y measurement direction to be thereby able to measure the Y-coordinate of the alignment destination layer. The interval P3 between the bar marks 10b adjacent to each other in the Y measurement direction is, for example, 10 μm to 100 μm. In the present embodiment, the alignment mark having the two bar marks 10b is exemplified. However, the number of bar marks 10b can be arbitrarily set (e.g., a few to approximately ten). A size (width W3) of the bar mark 10b in the Y measurement direction is a few μm to 10 μm, and a size in a non-measurement direction (X measurement direction) perpendicular to the Y measurement direction is basically arbitrary (e.g., 10 μm to 100 μm).

Referring to FIG. 14, the bar mark 10a is formed from a plurality of bar marks (interconnection marks 11) and spaces 12 that are alternately arranged along the Y measurement direction. The interconnection mark 11 is a wiring (e.g., metal wiring or silicide wiring) having a longitudinal direction in the measurement direction. A mark width WL of the interconnection mark 11 in the Y measurement direction is less than 1 μm between a lower limit and an upper limit in a design constraint. A width of the interconnection mark 11 in the X measurement direction (mark width in the longitudinal direction) is the same as the size of the bar mark 10a in the X measurement direction, i.e., a few μm to 10 μm. Also, a space width WS (Y measurement direction) of the spaces 12 between the plurality of bar marks (interconnection marks 11) is preferably less than 1 μm between the lower limit and the upper limit in the design constraint.

Referring to FIG. 15, the bar mark 10b is formed from a plurality of bar marks (interconnection marks 11) and the spaces 12 that are alternately arranged along the X measurement direction. The interconnection mark 11 is a wiring (e.g., metal wiring or silicide wiring) having a longitudinal direction in the measurement direction. A mark width WL of the interconnection mark 11 in the X measurement direction is less than 1 μm between the lower limit and the upper limit in the design constraint. A width of the interconnection mark 11 in the X measurement direction (mark width in the longitudinal direction) is the same as the size of the bar mark 10b in the Y measurement direction, i.e., a few μm to 10 μm.

The mark width WL of the interconnection mark 11 should be less than 1 μm because of the design constraint such as a wiring rule.

Similarly to the first embodiment, the space width WS of the space 12 between the interconnection marks 11 is preferably set to be shorter than the wavelength of the probe beam. For example, the mark width WL of the interconnection mark 11 and the space width WS of the space 12 are both 0.3 μm. The reason why the space width WS and the mark width WL are set to be shorter than the wavelength of the probe beam is as described in the first embodiment.

Also, if the intensity of a reflected beam from the interconnection mark 11 is too larger than that from the space 12, a resolution of the bar marks 10a and 10b may be reduced. For this reason, the mark width WL of the interconnection mark 11 and the space width WS of the space 12 are preferably the same.

From the above, considering measurement accuracies of the bar marks 10a and 10b, the mark width WL of the interconnection mark 11 and the space width WS of the space 12 in the measurement direction are preferably both the same, and less than 0.5 μm (note that a lower limit is in compliance with the design constraint). For example, the mark width WL of the interconnection mark 11 and the space width WS of the space 12 are both 0.3 μm. Also, the alignment mark (upper layer) is preferably formed from bar marks 20a and 20b respectively having similar configurations.

Referring to FIG. 13, the alignment mark (upper layer) has a plurality of bar marks 20a for X-coordinate measurement, which are arranged along the X measurement direction in a predetermined interval, and a plurality of bar marks 20b for Y-coordinate measurement, which are arranged along the Y measurement direction in a predetermined interval. The interval between the bar marks 20a adjacent to each other in the X measurement direction is, for example, 10 μm or less. In the present embodiment, the alignment mark having the two bar marks 20a is exemplified. However, the number of bar marks 20a can be arbitrarily set (e.g., a few to approximately ten). A size of the bar mark 20a in the X measurement direction is a few μm, and a size in the Y measurement direction perpendicular to the X measurement direction is basically arbitrary (e.g., a few μm). The interval between the bar marks 20b adjacent to each other in the Y measurement direction is, for example, 10 μm or less. In the present embodiment, the alignment mark having the two bar marks 20b is exemplified. However, the number of bar marks 20b can be arbitrarily set (e.g., a few to approximately ten). A size of the bar mark 20b in the Y measurement direction is a few μm, and a size in a non-measurement direction (X measurement direction) perpendicular to the Y measurement direction is basically arbitrary (e.g., a few μm).

The alignment mark (upper layer) may have a structure having interconnection marks 11 and the spaces 12 that are alternately arranged in the non-measurement (Y measurement) direction similarly to the alignment mark (lower layer), or a structure similar to the related one. That is, there are three cases, i.e., a case where only the alignment mark formed on the alignment destination layer is segmented, a case where only the alignment mark formed on the alignment layer is segmented, and a case where the alignment marks formed on the both layers are segmented.

The relative position between the alignment marks (upper and lower layers) is measured by the alignment measuring instrument, and the alignment destination layer and the alignment layer are aligned with each other such that the alignment mark (upper layer) (bar marks 20a and 20b) overlaps a region surrounded by the bar marks 10a and 10b.

Figure 16:
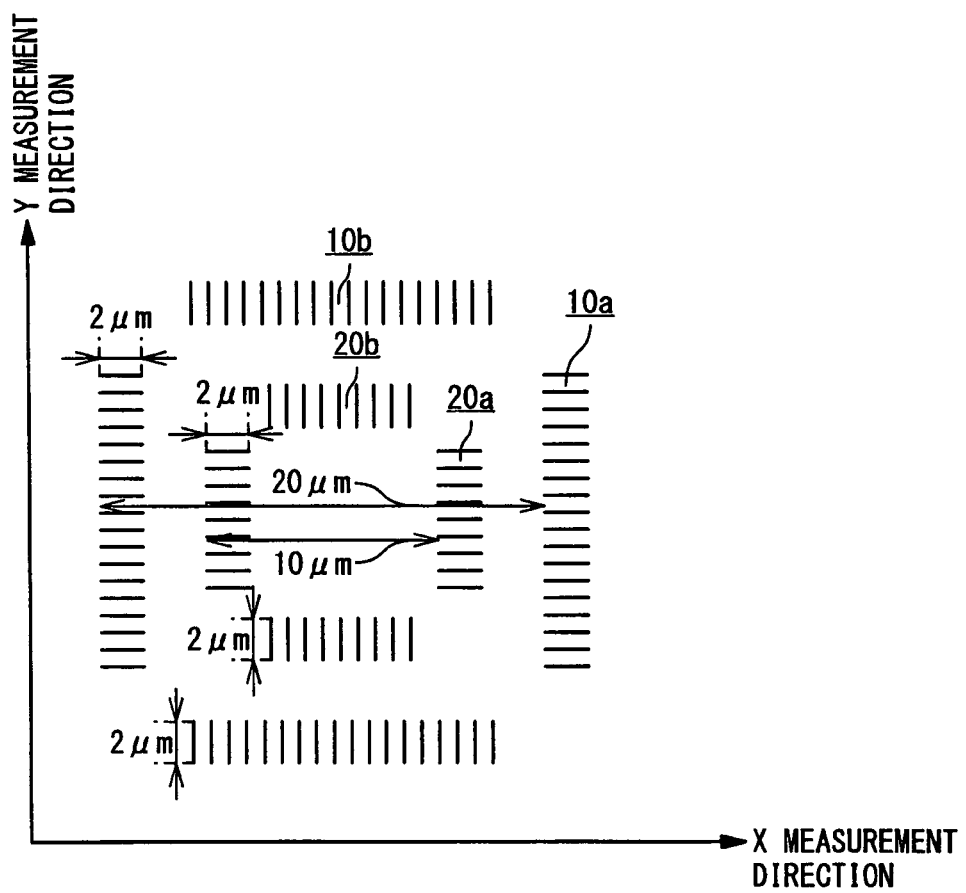
FIG. 16 is a diagram illustrating an example of configurations of the alignment marks in the second embodiment.
Figure 17:
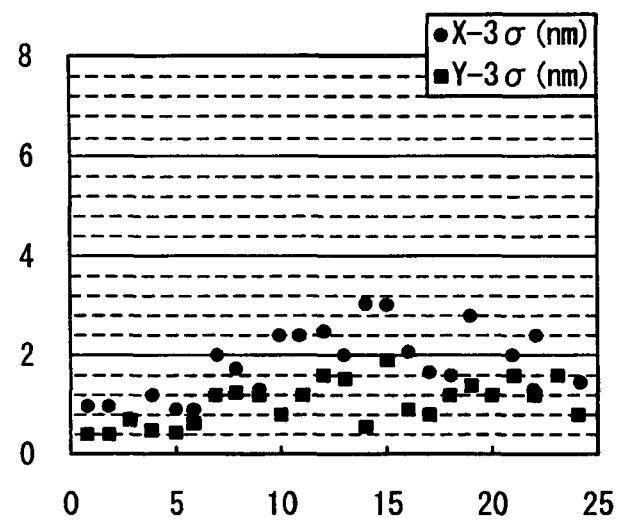
FIG. 17 is a diagram illustrating a reproducibility distribution characteristic of the alignment marks in the second embodiment.
Figure 18:
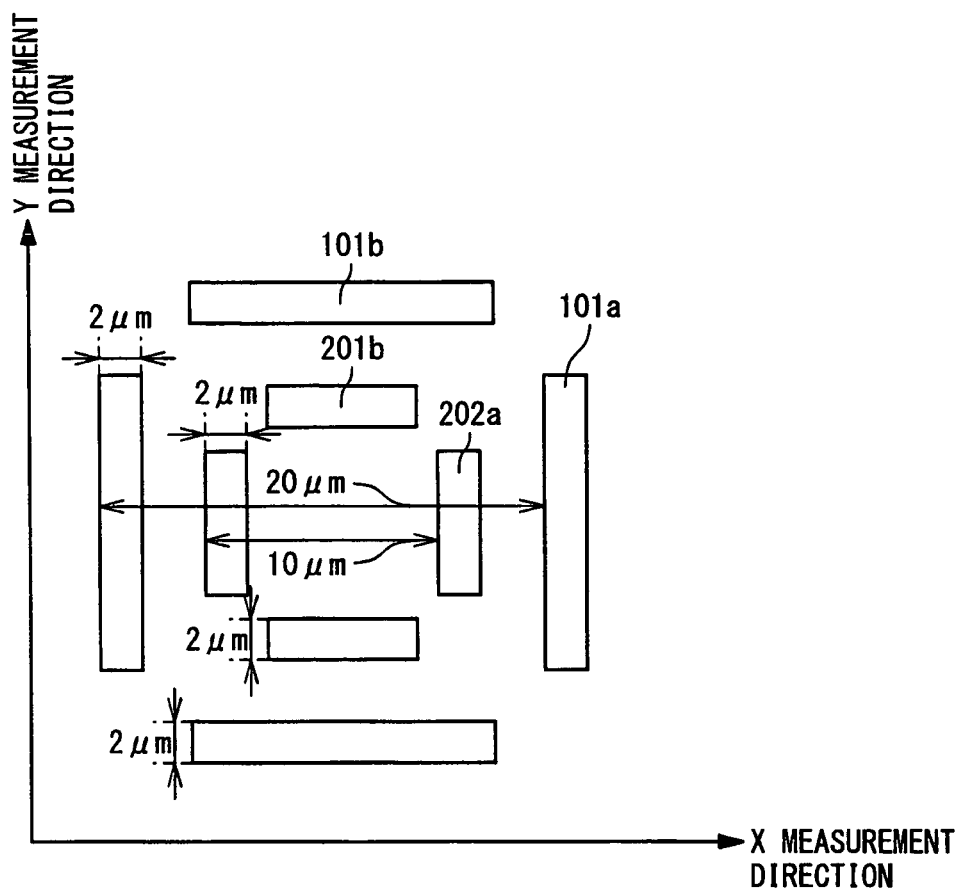
FIG. 18 is a diagram illustrating an example of configurations of alignment marks according to a related technique.
Figure 19:
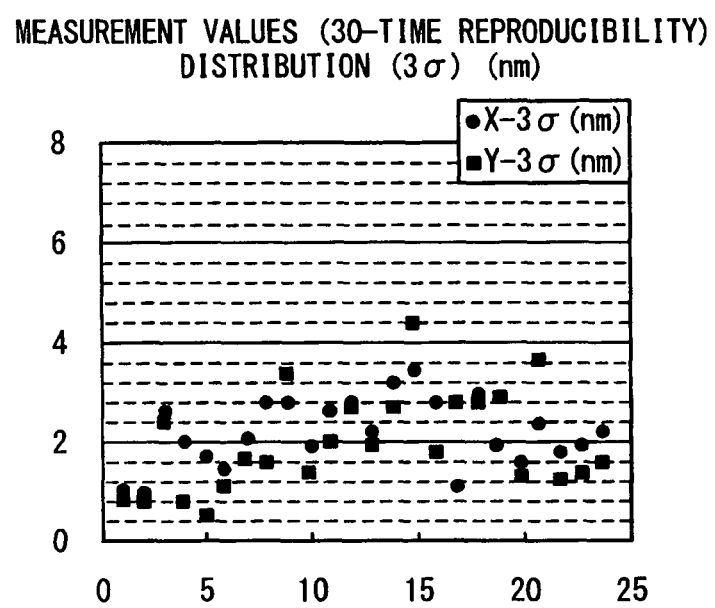
FIG. 19 is a diagram illustrating a reproducibility distribution characteristic of the alignment marks according to the related technique.

Referring to FIGS. 16 to 19, a specific example of the alignment marks in the present embodiment will be described. FIG. 16 is a diagram illustrating an example of configuration of the alignment marks in the second embodiment. FIG. 17 is a diagram illustrating a reproducibility distribution characteristic of the alignment marks in the second embodiment. FIG. 18 is a diagram illustrating an example of a configuration of alignment marks according to a related technique. FIG. 19 is a diagram illustrating a reproducibility distribution characteristic of the alignment marks according to the related technique.

The alignment mark (lower layer) illustrated in FIG. 16 is provided with two bar marks 10a arranged in the X measurement direction and two bar marks 10b arranged in the Y measurement direction. The widths W2 and W3 (FIG. 13) of the bar marks 10a and 10b respectively in their measurement directions are both 2 μm, the interval P2 between the bar marks 10a adjacent to each other in the X measurement direction is 20 μm, and the interval P3 between the bar marks 10b adjacent to each other in the Y measurement direction is 20 μm. Also, under the assumption that the lower limit and the upper limit in the design constraint are respectively 0.2 μm and 0.3 μm, the mark width WL of the interconnection mark 11 and the width WS of the space 12 in a non-measurement direction are both 0.3 μm. Short sides of bar marks 20a and 20b of the alignment mark (upper layer) are both 2 μm. In this experiment, the bar marks 20a and 20b are segmented similarly to the bar marks 10a and 10b (to have the interconnection marks 11 and the spaces 12).

The characteristics of the alignment mark in the present embodiment will be described in comparison with the related technique illustrated in FIG. 18. Referring to FIG. 18, the alignment mark (lower layer) according to the related technique is provided with two bar marks 101a arranged in the X measurement direction and two bar marks 101b arranged in the Y measurement direction. The widths W2 and W3 of the bar marks 101a and 101b are both 2 μm in their measurement directions, the interval between the bar marks 101a adjacent to each other is 20 μm in the X measurement direction, and the interval P3 between the bar marks 101b adjacent to each other is 20 μm in the Y measurement direction. The short sides of bar marks 201a and 201b of the alignment mark (upper layer) are both 2 μm. Under the assumption that there is no design constraint, the bar marks 101a and 101b are not segmented, unlike the present invention.

In the experiment of the present embodiment, the alignment measurement accuracy is evaluated by using as an index, a measurement value distribution (3δ) when the same target is repetitively measured. Referring to FIG. 17, measurement results (3σ values) of an X-coordinate when measuring the alignment mark (lower layer) 30 times are distributed in the range of 1.0 nm to 3.0 nm, and measurement results (3σ values) of a Y-coordinate are distributed in the range of 0.4 nm to 2.0 nm. Referring to FIG. 19, measurement results (3σ values) of an X-coordinate when measuring the alignment mark (lower layer) according to the related technique 30 times are distributed in the range of 1.0 nm to 3.7 nm, and measurement results (3σ values) of a Y-coordinate are distributed in the range of 1.0 nm to 4.5 nm.

As described, the distribution ranges of the measurement results (3σ values) of the alignment marks according to the present invention are narrower than those according to the related technique, both for the X- and Y-coordinates. That is, this experiment shows that the measurement accuracies (alignment accuracies) of the alignment marks according to the present invention, which are in compliance with the design constraint, are the same or more than those of the alignment marks according to the related technique, which are formed without taking into account the design constraint. It is thought that, in each of the alignment marks according to the present invention, the bar mark has the spaces 12 having a longitudinal direction corresponding to the measurement direction, so that a reflected beam intensity from the mark is reduced to improve a resolution of the alignment mark, and therefore a variation in measured coordinate is reduced as compared with the related case.

The alignment mark of the present invention is used in a lithography process. Referring to FIG. 20, an example of the lithography process using the alignment mark according to the present invention will be described. FIG. 20 is a flowchart illustrating the example of the lithography process according to the present invention.

Here, it is assumed that the alignment mark 1 is previously formed on a silicon wafer (or semiconductor substrate with a circuit or with no circuit), and an alignment destination layer including the alignment mark (lower layer) illustrated in FIG. 13 is also previously formed.

First, a photo-resist is coated by a coater on the entire surface of the silicon wafer (films may be formed on the entire surface) (Step S1). Then, the silicon wafer is heated in a pre-baking furnace (pre-baking step: Step S2).

Subsequently, the control flow proceeds to steps of exposing a circuit pattern (Steps S3 to S5). The exposure step is performed by a stepper apparatus (exposure apparatus) by using UV light or the like, so that a predetermined pattern (alignment layer) including a pattern of circuit elements and the alignment mark is transcribed on a surface of the photo-resist. It should be noted that the pattern to be exposed may be only the alignment mark 1.

Details of the exposure steps will be described below. First, the stepper apparatus adjusts a position of the semiconductor substrate (or wafer) (Step S3). Specifically, the stepper apparatus irradiates the detection beam (the probe beam) to the alignment mark 1 on the alignment destination layer to detect positional data on the alignment mark 1. In the present embodiment, the probe beam is scanned along a predetermined measurement direction, and variation in reflected beam intensity, which is caused by the presence or absence of the bar mark 10, is used to detect a positional coordinate of the alignment mark 1. On the basis of the positional coordinate of the alignment mark 1, the stepper apparatus adjusts the position of the semiconductor substrate (wafer) to move the semiconductor substrate to an appropriate position.

Then, the stepper apparatus adjusts a relative position between the alignment mark (upper layer) formed on the alignment layer and the alignment mark (lower layer) (Step S4). Specifically, the alignment layer is located on the alignment destination layer, the detection beam is irradiated on the alignment marks (upper and lower layers respectively formed on the layers), and positional coordinates of the alignment marks (upper and lower layers) are detected on the basis of reflected beam intensities. The stepper apparatus adjusts the relative position of the alignment marks (upper and lower layers) on the basis of the detected positional coordinates. At this time, the detection beam is scanned in the X-direction and the Y-direction orthogonal to the X-direction to detect positional coordinates of the bar marks 10a and 10b of the alignment marks (upper and lower layers). On the basis of the relative coordinate between the alignment marks (upper and lower layers), the alignment layer is positioned to align an exposure position of the circuit pattern to be transcribed onto the alignment destination layer.

When the exposure position of the circuit pattern is determined, the stepper apparatus (exposure apparatus) uses the UV light or the like to expose the predetermined pattern (alignment layer) including the pattern of the circuit elements and alignment mark on the surface of the photoresist (Step S5).

Then, the silicon wafer is again heated (post-baking step), and then the photo-resist is developed (development step: Step S6). Subsequently, the patterned photo-resist is used as a mask, and the surface of the silicon wafer is etched to form the pattern by wet or dry etching (etching step: Step S7). A resist remover is used to remove the photo-resist (resist removing step: Step S8).

In the manner described above, the circuit pattern including the alignment mark (alignment mark (upper layer)) is formed on the silicon wafer (alignment destination layer). The alignment pattern may be provided at the same location as or a different location from an alignment pattern (alignment mark (lower layer)) of the alignment destination layer. Also, a shape of the alignment pattern may be any of the same, similar, or different shape. Further, the alignment mark (upper layer) used in the lithography process may function as an alignment mark (lower layer) that is to be used for alignment for the case of further forming a circuit pattern on the upper layer.

As described above, in the lithography process, the alignment pattern that has been formed together with the circuit element pattern in the previous step is used to adjust (align) the position of the silicon wafer. Then, through the respective steps of exposure, development, and etching, the alignment pattern and circuit pattern for a next process are formed.

After the above-described steps S1 to S8, steps of depositing metal films and insulating films, ion implantation step, and other steps (not illustrated) are repeated and a semiconductor device is manufactured to be mounted with a desired circuit.

As described above, the alignment mark according to the present invention is formed of the bar marks, in each of which the marks (interconnection marks 11) and the spaces 12 are alternately arranged to have the interconnection widths complying with the design constraint. An arrangement direction of the interconnection marks 11 and the spaces 12 corresponds to the non-measurement direction that is uniquely determined from principles of the exposure apparatus and the alignment measuring instrument and a planar structure (shape) of the alignment mark. The mark width WL of the interconnection mark 11 and the width WS of the space 12 are preferably both less than 0.5 μm. Thus, a resolution of the mark can be improved to thereby reduce a measurement error. Accordingly, by forming the alignment mark on a wafer in the present invention, a transcribed circuit pattern and a circuit pattern to be subsequently transcribed can be aligned with each other with accuracy.

The embodiments of the present invention have been described in detail above. However, the present invention is not limited to any of the above-described embodiments, but any modification without departing from the scope of the present invention is included in the present invention.

What is claimed is:

1. A semiconductor device comprising an alignment mark, wherein a detection beam is scanned on said alignment mark so as to detect a position coordinate of said alignment mark,
wherein said alignment mark comprises a plurality of first bar marks, which are arranged in a first predetermined interval along a first direction of scanning said detection beam,
wherein each of said plurality of first bar marks comprises a plurality of first interconnection marks, which are arranged along a second direction orthogonal to said first direction, wherein a first space between two adjacent first interconnection marks is shorter than a wavelength of said detection beam within a range of a design constraint, and
wherein said alignment mark further comprises a plurality of second bar marks, which are arranged in a second predetermined interval along the second direction,
wherein each of said plurality of second bar marks comprises a plurality of second interconnection marks, which are arranged along the first direction, and
wherein a second space between two adjacent second interconnection marks is shorter than the wavelength of said detection beam within the range of the design constraint.

2. The semiconductor device according to claim 1, wherein a first interconnection width of each of said plurality of first interconnection marks in the second direction is within the range of the design constraint.

3. The semiconductor device according to claim 2, wherein said first interconnection width and said first space is less than 1 μm.

4. The semiconductor device according to claim 2, wherein said first space is equal to said first interconnection width.

5. The semiconductor device according to claim 4, wherein said first interconnection width is less than 0.5 μm.

6. The semiconductor device according to claim 1, wherein the plurality of bar marks includes a first bar mark and a second bar mark, a distance between the first bar mark and the second bar mark comprises a first distance, and
the first distance is greater than a length of the first interconnection marks of the first bar mark when measured in the first direction of scanning.

7. The semiconductor device according to claim 1, wherein the first space between two adjacent first interconnection marks comprises a first distance when measured in the second direction, and
the first distance is equal to a width of one of the first interconnection marks when measured in the second direction.

8. The semiconductor device according to claim 1, wherein the first space is equal to or less than a resolution of the detection beam.

9. The semiconductor device according to claim 1, wherein the first predetermined interval between two adjacent first marks is greater than the wavelength of said detection beam.

10. The semiconductor device according to claim 9, wherein marks are not formed in a space between two adjacent first marks in the first direction.

11. The semiconductor device according to claim 1, wherein marks are not formed in a space between two adjacent first marks in the first direction.

12. A manufacturing method of a semiconductor device, the manufacturing method comprising:
irradiating and scanning a detection beam on a first alignment mark formed on a semiconductor substrate with a photo-resist layer;
detecting a coordinate position of said first alignment mark from an intensity of a reflection of said detection beam;
adjusting a position of said semiconductor substrate based on the detected coordinate position;
irradiating and scanning the detection beam on said first alignment mark and a second alignment mark formed on a mask with a predetermined circuit pattern including said second alignment mark;
detecting coordinate positions of said first and second alignment marks from reflection intensities of said detection beam;

adjusting a relative position of said semiconductor substrate and said mask based on the detected coordinate positions; and exposing a photo-resist layer of said semiconductor substrate to form the circuit pattern, wherein said first alignment mark comprises a plurality of first bar marks, which are arranged in a first predetermined interval along a first direction of the scanning of said detection beam, wherein each of said plurality of first bar marks comprises a plurality of first interconnection marks, which are arranged along a second direction orthogonal to said first direction, wherein a first space between two adjacent first interconnection marks is shorter than a wavelength of said detection beam within a range of a design constraint, and wherein said second alignment mark comprises a plurality of second bar marks, which are arranged in a second predetermined interval along said first direction, wherein each of said plurality of second bar marks comprises a plurality of second interconnection marks, which are arranged along said second direction, and wherein a second space between two adjacent second interconnection marks is shorter than the wavelength of said detection beam within the range of the design constraint.

13. The manufacturing method according to claim 12, wherein said first alignment mark further comprises a plurality of third bar marks arranged in a third predetermined interval along said second direction, wherein each of said plurality of third bar marks comprises a plurality of third interconnection marks, which are arranged along the first direction, wherein a third space between two adjacent third interconnection marks is shorter than the wavelength of said detection beam within the range of the design constraint, wherein said second alignment mark further comprises a plurality of fourth bar marks, which are arranged in a fourth predetermined interval along a second direction of the scanning of said detection beam, wherein each of said plurality of fourth bar marks comprises a plurality of fourth interconnection marks, which are arranged along a second direction orthogonal to said first direction, wherein a fourth space between two adjacent first interconnection marks is shorter than a wavelength of said detection beam within the range of the design constraint, and wherein said irradiating and scanning comprises irradiating the detection beam and scanning the detection beam along the first direction and the second direction.

14. The manufacturing method according to claim 12, wherein the first predetermined interval between two adjacent first marks is greater than the wavelength of said detection beam in the first direction.

15. The manufacturing method according to claim 12, wherein marks are not formed in a space between two adjacent first marks.

16. The manufacturing method according to claim 15, wherein marks are not formed in a space between two adjacent first marks in the first direction.

17. A semiconductor device, comprising:

a substrate with a pattern transcribed thereon; and an alignment mark, which if scanned by a detection beam, is used to determine a position of the pattern transcribed on the substrate, the alignment mark comprising a first bar mark and a second bar mark each being arranged along a first direction with a first space formed therebetween, wherein the first bar mark and the second bar mark each comprise a first interconnection mark and a second interconnection mark each being arranged along a second direction that is orthogonal to the first direction with a second space formed therebetween, and the detection beam having a wavelength that is greater than a width of the second space when measured in the second direction.

18. The semiconductor according to claim 17, wherein the wavelength of the detection beam is greater than a width of the first interconnection mark of the first bar mark when measured in the second direction.

19. The semiconductor according to claim 18, wherein the width of the second space is equal to the width of the first interconnection mark of the first bar mark.

20. The semiconductor according to claim 17, wherein the first bar mark has a length measured along the second direction and a width measured along the first direction, the length is greater than the width.

21. The semiconductor according to claim 17, wherein the first space having a length when measured along the first direction that is greater than a width of the second space when measured along the second direction.

* * * * *